United States Patent [19]

Itakura et al.

[11] Patent Number: 4,636,919
[45] Date of Patent: Jan. 13, 1987

[54] MULTILAYER PRINTED CIRCUIT BOARD

[75] Inventors: Sakae Itakura, Ayase; Osamu Morikawa, Fujisawa, both of Japan

[73] Assignee: Hitachi, Ltd., Tokyo, Japan

[21] Appl. No.: 828,717

[22] Filed: Feb. 12, 1986

[30] Foreign Application Priority Data

Mar. 20, 1985 [JP] Japan .................................. 60-54260
Mar. 27, 1985 [JP] Japan .................................. 60-60566

[51] Int. Cl.⁴ ............................................. H05K 1/14
[52] U.S. Cl. .................................. 361/414; 174/68.5; 361/409
[58] Field of Search ............... 174/68.5; 361/414, 406, 361/409, 412

[56] References Cited

U.S. PATENT DOCUMENTS

| | | | |
|---|---|---|---|
| 3,876,822 | 4/1975 | Davy et al. | 361/409 X |
| 3,923,360 | 12/1975 | Rougon et al. | 174/68.5 X |
| 4,298,770 | 11/1981 | Nishihara et al. | 361/409 X |
| 4,434,321 | 2/1984 | Betts | 174/68.5 |
| 4,438,560 | 3/1984 | Kisters | 174/68.5 X |
| 4,524,239 | 6/1985 | Rouge | 174/68.5 |

FOREIGN PATENT DOCUMENTS

| | | | |
|---|---|---|---|
| 2553534 | 2/1977 | Fed. Rep. of Germany | 174/68.5 |
| 55-103793 | 8/1980 | Japan | 361/414 |
| 57-52949 | 11/1982 | Japan | 361/414 |

Primary Examiner—R. R. Kucia
Attorney, Agent, or Firm—Antonelli, Terry & Wands

[57] ABSTRACT

A multilayer printed circuit board comprises: part terminal insertion holes and part terminal insertion lands formed at intersecting points between a first plurality of main reference grid lines extending in one direction and a second plurality of main reference grid lines extending in the other direction perpendicular to the one direction; at least two signal layers, one of the signal layers being constituted by first signal lines disposed on a plurality of ones of first subsidiary grid lines drawn parallelly with the first main reference grid lines on positions obtained by equidistantly dividing each gap between adjacent ones of the first main reference grid lines into n portions, the other one of the signal layers being constituted by second signal lines disposed on a plurality of ones of second subsidiary grid lines drawn parallelly with the second main reference grid lines on positions obtained by equidistantly dividing each gap between adjacent ones of the second main reference grid lines into n portions; and via holes formed on diagonal lines of the first and second main grid reference lines at positions displaced from intersecting points between the first and second signal lines to be close to intersecting points between the first and second main grid reference lines, each of the via holes having a diameter smaller than that of each of the part terminal insertion holes and the part terminal insertion land, the via holes being exclusively used for connecting the first and second signal lines, a plurality of ones of the via holes being formed in each of regions encircled by the first and second main grid reference lines.

20 Claims, 8 Drawing Figures

FIG. I
PRIOR ART
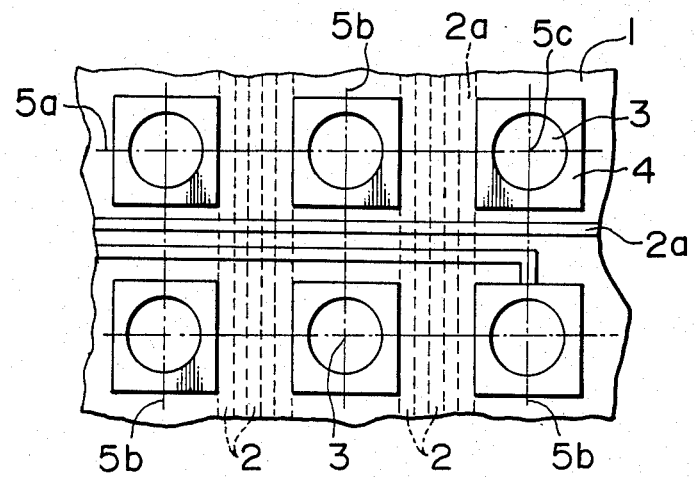
FIG. 2
PRIOR ART
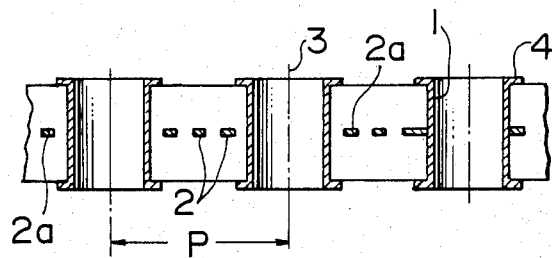

MULTILAYER PRINTED CIRCUIT BOARD

BACKGROUND OF THE INVENTION

The present invention generally relates to a multilayer printed circuit board and particularly relates to a multilayer printed circuit board in which an inner layer pattern such as an earthing layer, a power supply layer, or the like, is standardized so that the inner layer pattern can be commonly used even if a pattern of a signal layer is varied.

FIGS. 1 and 2 show the conventional multilayer printed circuit board. In the drawings, the reference numeral 1 designates a multilayer printed circuit board, and the reference numeral 2 designates a signal layer formed as an inner layer and constituted by a plurality of signal lines 2a. The reference numerals 3 and 4 designate terminal insertion holes and terminal insertion lands for mounted parts, which are formed at intersecting points 5c between a first plurality of main reference grid lines 5a and a second plurality of main reference grid lines 5b extending perpendicularly to each other, that is, the main reference grid lines 5a in the first plurality extending in the longitudinal direction while the main reference grid lines 5b in the second plurality extending in the transversal direction. In such an arrangement as described above, for example, in the case where one grid pitch P between the intersecting points 5c is selected to be 2.54 mm, it is possible to make the maximum number n of signal lines 2a in one grid be four, while similarly to this case, in the case where the grid pitch P is selected to be 1.27 mm, it is possible to make the maximum number n of signal lines 2a in one grid be one or two, so that a density of signal lines on a printed substrate can be made high. Thus, in the prior art multilayer printed circuit board, although making high the density of signal lines on the printed substrate has been taken into consideration, in the case where signal lines of signal layers carrying patterns different from each other are connected to each other, only the intersecting points 5c between the main reference grid lines 5a and 5b have been utilized for via holes each exclusively used to connect the signal line thereto. In this case, the number of terminal insertion holes 3 used as part terminal insertion holes has been limited, so that there has been such anxiety that a density of actually mounted parts is reduced. Further, when the via holes each exclusively used to connect the signal line 2a thereto are formed at the intersecting points 5c between the main reference grid lines 5a and 5b, gaps between signal lines 2a are made unequal, so that the insulating characteristic between signal lines 2a is varied depending on the positions of the signal lines 2a, resulting in deterioration in the entire insulating characteristic.

Moreover, generally, in the multilayer printed circuit board, an inner layer pattern such as an earthing layer, a power supply layer, or the like, which is formed by etching copper foil, is sometimes provided as an inner layer. In view of the purpose of provision of the earthing layer or the power supply layer, it is required for the inner layer to carry a pattern continued all over the entire plane of the printed circuit board except portions which are not electrically connected to peripheral portions of the terminal insertion holes 3 (hereinafter, referred to as clearance holes). Further, for example, as a matter of course, the terminal insertion hole used to insert a power supply terminal of an LSI therein is connected to the power supply layer.

In the case where the foregoing via holes are formed in such a multilayer printed circuit board containing the inner layer pattern such as a power supply layer, an earthing layer, or the like, it is a matter of course that the clearance holes must be formed at the peripheral portions of the via hole. On the other hand, it is the real situation that at the most one via hole can be formed in each region sectioned by the main reference grid lines 5a and 5b, as shown in FIG. 1 because of the foregoing requirement for the inner layer pattern (that is, the inner layer pattern must be continued all over the entire plane of the printed circuit substrate). Otherwise, central clearance holes used for a plurality of via holes are communicated with clearance holes used for the terminal insertion holes 3, which are disposed adjacently on both sides thereof, so that the inner layer pattern in which the clearance holes are communicated with each other does not function as the power supply layer or the earthing layer. Further, conventionally, since via holes have been formed only at positions where among a plurality of signal lines 2a respectively extending in the longitudinal and transversal directions, signal lines to be actually connected to the via hole are disposed, inner layer patterns are different from each other for individual printed circuit boards, resulting in increase in designing of the inner layer pattern and/or in manufacturing the boards.

Although there are some prior art references as to the multilayer printed circuit board of this kind, for example, Japanese Utility Model Publication No. 57-52949, Japanese Patent Unexamined Publication No. 55-103793, etc., it has not been taken into consideration at all that the degree of freedom in design of the signal layer is improved by increasing the number of via holes, or that one inner layer pattern is made to be commonly used for various circuit boards by standardizing the inner layer pattern.

SUMMARY OF THE INVENTION

An object of the present invention is to improve the degree of freedom in design of a signal layer pattern by forming a plurality of via holes in each of regions sectioned by main reference grid lines.

Another object of the present invention is to provide a multilayer printed circuit board having via holes, in which an inner layer pattern such as an earthing layer or a power supply layer can be standardized or made to be commonly used.

According to an aspect of the present invention, the multilayer printed circuit board comprises: part terminal insertion holes and part terminal insertion lands formed at intersecting points between a first plurality of main reference grid lines extending in one direction and a second plurality of main reference grid lines extending in the other direction perpendicular to the one direction; at least two signal layers, one of the signal layers being constituted by first signal lines disposed on a plurality of ones of first subsidiary grid lines drawn parallelly with the first main reference grid lines on positions obtained by equidistantly dividing each gap between adjacent ones of the first main reference grid lines into n portions, the other one of the signal layers being constituted by second signal lines disposed on a plurality of ones of second subsidiary grid lines drawn parallelly with the second main reference grid lines on positions obtained by equidistantly dividing each gap between adjacent ones of the second main reference grid lines into n portions; and via holes formed on diagonal lines of the first and second main grid reference lines at positions displaced from intersecting points between the first and second signal lines to be close to intersecting points between the first and second main grid reference lines, each of the via holes having a diameter smaller than that of each of the part terminal insertion holes and the part terminal insertion land, the via holes being exclusively used for connecting the first and second signal lines.

The above and other objects of the present invention will be seen from the following detailed description taken in conjunction with the accompanying drawings.

BRIEF DESCRIPTION OF THE DRAWINGS

FIG. 1 is a plane view showing the conventional multilayer printed circuit board;

FIG. 2 is a longitudinal view in cross section showing the conventional multilayer printed circuit board of FIG. 1;

DESCRIPTION OF THE PREFERRED EMBODIMENTS

Figure 3:
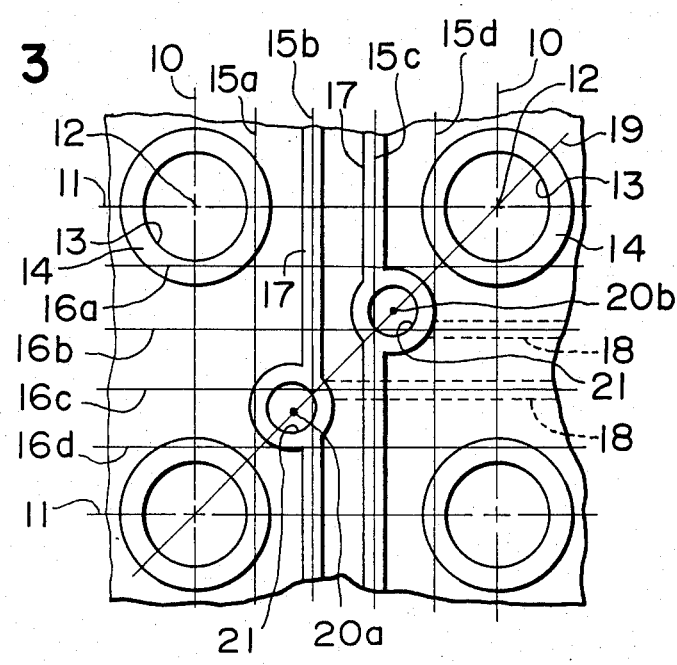
FIG. 3 is a plane view showing a first embodiment of the multilayer printed circuit board according to the present invention.

Referring to the drawings, three embodiments according to the present invention will be described in detail hereunder.

Figure 4:
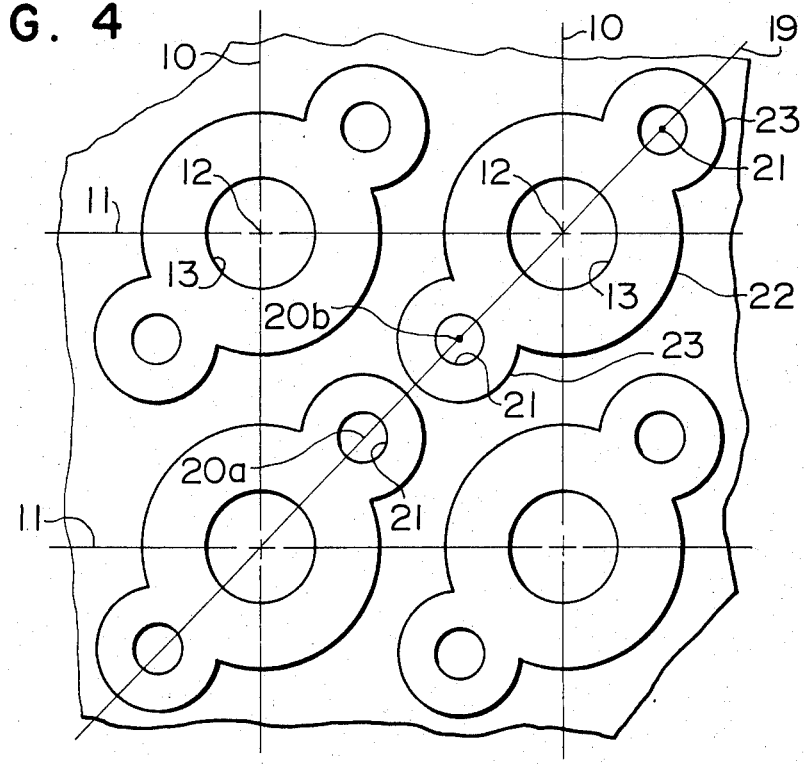
FIG. 4 is a plane view showing a part of the inner layer pattern such as an earthing layer or a power supply layer in the first embodiment of FIG. 4.

FIGS. 3 and 4 show a first embodiment according to the present invention, in which two longitudinally extending lines and two transversely extending lines, and two via holes are provided in each region enclosed by four terminal insertion holes (hereinafter, referred to as each unit region). In each of FIGS. 3 and 4, only one unit region is illustrated.

In this embodiment, terminal insertion holes 13 and terminal insertion lands 14 for mounted parts are formed at intersecting points 12 between a first plurality of main reference grid lines 10 and a second plurality of main reference grid lines 11 extending perpendicularly to each other, that is, the main reference grid lines 10 in the first plurality extending in the longitudinal direction while the main reference grid lines 11 in the second plurality extending in the transversal direction. In the drawing, respective subsidiary grid lines 15a, 15b, 15c, and 15d extending in the longitudinal direction, and subsidiary grid lines 16a, 16b, 16c, and 16d extending in the transversal direction are drawn at positions obtained by equidistantly dividing a gap between the longitudinal main reference grid lines 10 and 10, and a gap between the transversal main reference grid lines 11 and 11 into five portions respectively. Longitudinal signal lines 17 and 17, and transversal signal lines 18 and 18 are disposed at the longitudinal subsidiary grid lines 15b and 15c and the transversal subsidiary grid lines 16b and 16c respectively, the subsidiary grid lines 15b and 15c or 16b and 16c being disposed adjacently to each other at the most central position, that is, at the positions of 1/5 and 3/5 viewed from one main reference grid line. Respective via holes 21 and 21 are formed at positions 20a and 20b disposed on a diagonal line 19 in each unit region sectioned by the main reference grid lines 10 and 10, and 11 and 11, and displaced from the intersecting points between the signal line 17 and 18, and 17 and 18 to be close to intersecting points 12 and 12 between the main reference grid lines 10 and 11, and 10 and 11, the via hole 21 having a diameter smaller than that of the terminal insertion hole 13 and the part terminal insertion land 14 for a mounted part and being exclusively used to connect the signal lines 17 and 18 thereto. Further, in general, it often happens that the signal lines 17 and 17 or 18 and 18 are provided on the same signal layer surface and the signal lines 17 and 18 are provided on signal layer surfaces different from each other. Moreover, in the foregoing embodiment, the respective two via holes 21 are formed at positions 20a and 20b displaced from intersecting points between the subsidiary grid lines 15b–16c and 15c–16b, and therefore distances between the via holes 21 and other terminal insertion holes 13 formed in the signal layers 17 and 18 are made substantially uniform, so that the insulating characteristic of the entire printed circuit substrate is improved.

FIG. 4 shows the inner layer pattern such as an earthing layer or a power supply layer in the vicinity of one unit region, and a large clearance hole 22 is formed in the surrounding of each terminal insertion hole 13, while a small clearance hole 23 is formed in the surrounding of each via hole 21 having a size suitable for the via hole 21. The clearance holes are formed by etching copper foil, and it is important that the one large clearance hole 22 and the two small clearance holes 23 are integrally provided with each other to form a clearance area which is not communicated with other clearance areas. That is, a copper foil portion remained through etching is continued all over the entire printed circuit substrate for making it possible to function as the earthing layer or the power supply layer. The foregoing effect is obtained owing to the fact that the via holes 21 are formed at the positions displaced on the diagonal line 19. By standardizing such a clearance area, it is possible to make the inner layer pattern be used commonly regardless forming the via holes 21 at the positions 21a and 20b, so that the inner layer pattern can be utilized as a reference part for all the printed circuit boards.

Further, in the three-dimensional multilayer circuit board, it is made possible to use opposite surfaces thereof as the signal layer and to provide the earthing layer or the power supply layer, or alternatively both the layers as an inner layer or inner layers thereof. Moreover, another signal layer may be provided as the inner layer.

Figure 5:
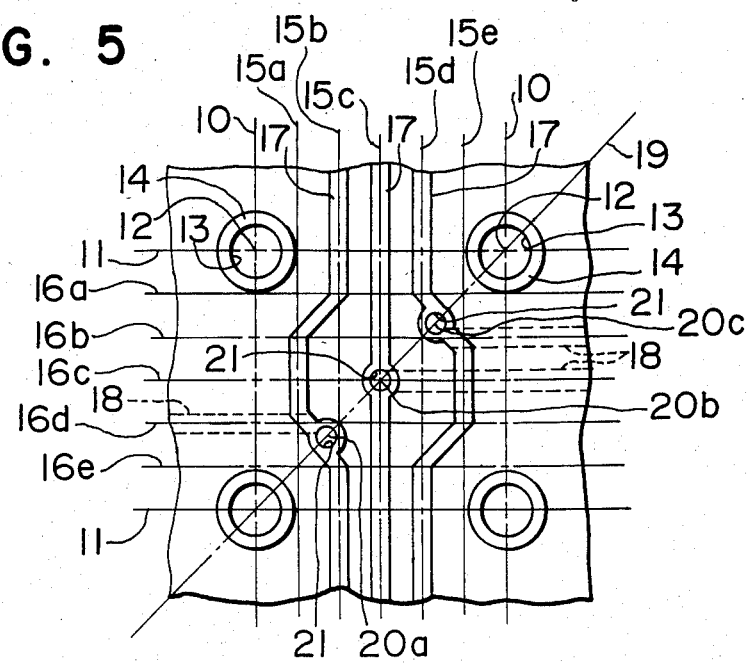
FIG. 5 is a plane view showing a second embodiment of the multilayer printed circuit board according to the present invention.
Figure 6:
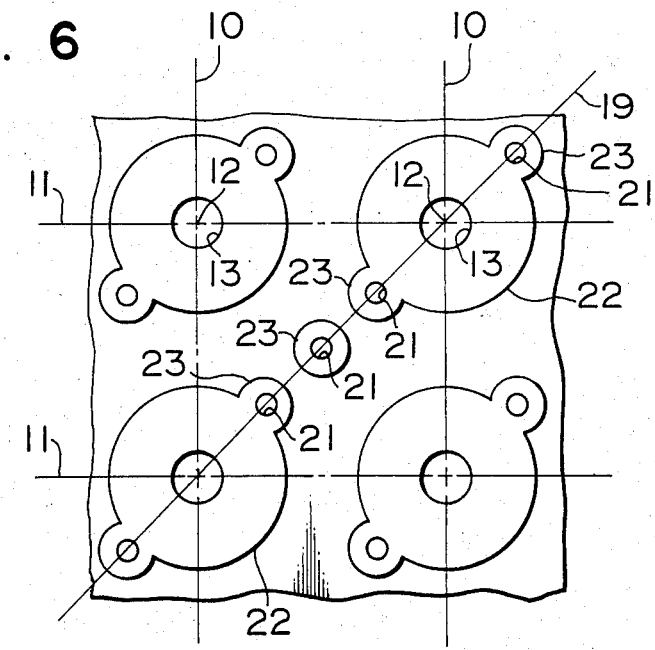
FIG. 6 is a plane view showing a part of the inner layer pattern such as an earthing layer or a power supply layer in the second embodiment of FIG. 5.

Next, FIGS. 5 and 6 show a second embodiment according to the present invention, in which three longitudinally extending signal lines and three transversely extending signal lines, and three via holes are provided in each unit region. In FIGS. 5 and 6, constituent components corresponding to those in FIGS. 3 and 4 are correspondingly referenced.

In this embodiment, a gap between longitudinal main reference grid lines 11 and 11 are equidistantly divided into six portions to draw five longitudinal subsidiary grid lines 15a–15e and five transversal subsidiary grid lines 16a–16e respectively, and the respective three longitudinal signal lines 17 and three transversal signal lines 18 are disposed on central three longitudinal subsidiary grid lines 15b, 15c, and 15d and central three transversal subsidiary grid lines 16b, 16c, and 16d among the subsidiary grid lines 15a–15e and 16a–16e.

A central via hole 21 is formed at an intersecting point 20b between the subsidiary grid lines 15c and 16c, however, respective two other via holes 21 are formed at positions disposed on a diagonal line 19 and displaced to be close to the nearest intersecting points 12 in the same manner as in the first embodiment of FIG. 3. Further, the signal lines 17 disposed on the opposite side of the central signal line 17 are partly bent to properly maintain distances between the central via hole 21 and the two other via holes 21 respectively.

As shown in FIG. 6, an inner layer pattern in this embodiment is similar to that provided with the clearance holes 22 and 23 as shown in FIG. 4 except independently providing a clearance hole 23 used for the central via hole 21.

Figure 7:
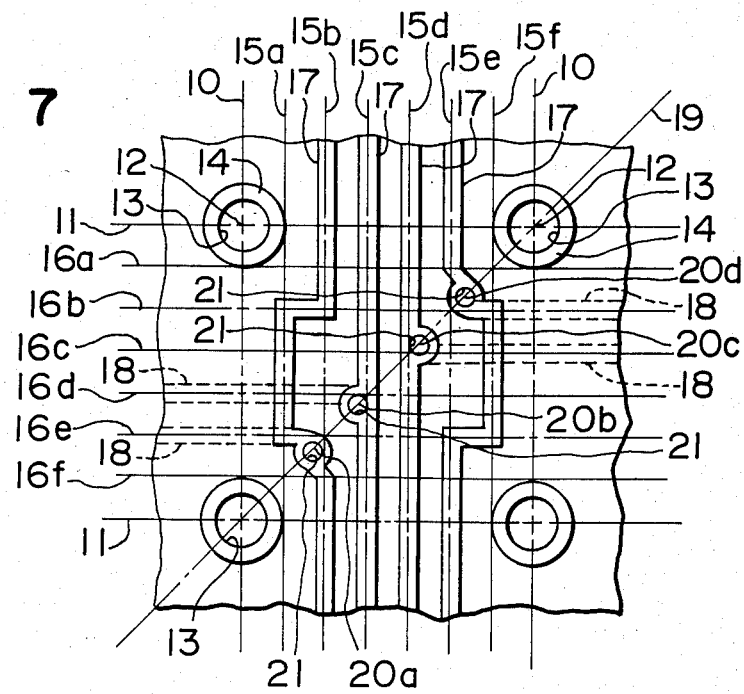
FIG. 7 is a plane view showing a third embodiment of the multilayer printed circuit board according to the present invention.
Figure 8:
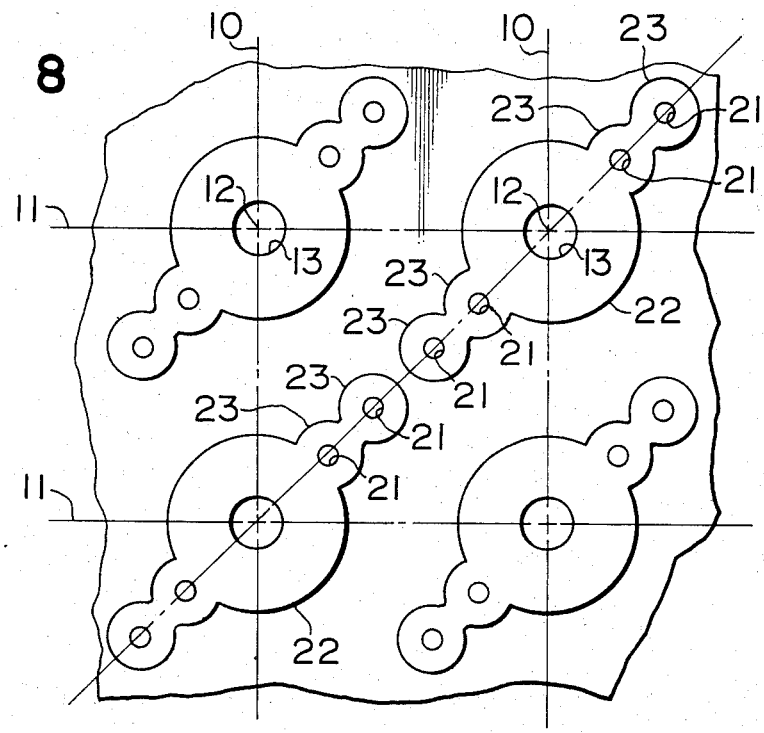
FIG. 8 is a plane view showing a part of the inner layer pattern such as an earthing layer or a power supply layer in the third embodiment of FIG. 7.

Next, FIGS. 7 and 8 show a third embodiment according to the present invention, in which four longitudinally extending signal lines and four transversely extending signal lines, and four via holes are provided in each unit region. In FIGS. 7 and 8, constituent components corresponding to those in FIGS. 3 and 4 are correspondingly referenced.

In this embodiment, respective six longitudinal subsidiary grid lines 15a–15f and six transversal subsidiary grid lines 16a–16f are disposed on positions obtained by equidistantly dividing a gap between longitudinal main reference grid lines 10 and 10 and a gap between transversal main reference grid lines 11 and 11 into seven portions, and the respective four longitudinal signal lines 17 and four transversal signal lines 18 are disposed on central four longitudinal subsidiary grid lines 15b–15e and central four transversal subsidiary grid lines 16b–16e among the subsidiary grid lines 15a–15f and 16a–16f.

Among the four via holes 21 formed on diagonal line 19, two upper right via holes 21 are displaced to be close to an upper right terminal insertion hole 13 while two lower left via holes 21 are displaced to be close to a lower left terminal insertion hole 13. Further, the signal lines 1 disposed on the opposite sides of the central two signal lines 17 are partly bent to properly maintain distances between the central two via holes 21 and the two other via holes 21 respectively.

As shown in FIG. 8, an inner layer pattern is arranged such that a large clearance hole 22 is integrally formed with four small clearance holes 23 so that copper foil remained through etching is continued all over the entire substrate.

As described above, according to the present invention, the via hole is formed at the position displaced from the intersecting point between the subsidiary grid lines by a predetermined distance to thereby make large the distance between the via holes, so that it is possible to form the clearance hole at the position of the inner layer such as an earthing layer or a power supply layer corresponding to the position of the via hole.

Further, according to the present invention, in the case where longitudinal and transversal signal lines are different in number from each other when no land is formed at the intersecting point between the main reference grid lines, for example, in the case of provision of two longitudinal and four transversal signal lines, or even in the case where a gap between the lands, that is, between the main reference grid lines is equidistantly divided into portions not smaller than eight portions in the same manner as in the foregoing embodiments, it is possible to form the clearance hole having a circular shape in cross section at the position of the inner layer such as an earthing layer or a power supply layer corresponding to the position of the via hole by forming it at a position displaced from the intersecting point between the subsidiary grid lines by a predetermined distance.

As described above, according to the present invention, a distance between via holes is made large by forming each via hole at the position displaced from the intersecting point between the subsidiary grid lines by a predetermined distance, so that it is possible to form a plurality of via holes in each unit region and further it is possible to form the clearance hole at the position of the inner layer such as an earthing layer or a power supply layer corresponding to the position of the via hole, and therefore there is such an effect that the earthing layer or the power supply layer can be standardized, that is, the inner layer pattern can be made to be commonly used even if a pattern of the signal layer is varied.

We claim:

1. A multilayer printed circuit board comprising:
   part terminal insertion holes and part terminal insertion lands formed at intersecting points between a first plurality of main reference grid lines extending in one direction and a second plurality of main reference grid lines extending in the other direction perpendicular to said one direction;
   at least two signal layers, one of said signal layers being constituted by first signal lines disposed on a plurality of ones of first subsidiary grid lines drawn parallelly with said first main reference grid lines on positions obtained by equidistantly dividing each gap between adjacent ones of said first main reference grid lines into n portions, the other one of said signal layers being constituted by second signal lines disposed on a plurality of ones of second subsidiary grid lines drawn parallelly with said second main reference grid lines on positions obtained by equidistantly dividing each gap between adjacent ones of said second main reference grid lines into n portions;
   via holes formed at positions displaced from intersecting points between said first and second signal lines, each of said via holes having a diameter smaller than that of each of said part terminal insertion holes and said part terminal insertion land, each of said via holes being exclusively used for connecting said first and second signal lines; and
   an inner layer pattern for an earthing layer or a power supply layer, said inner layer pattern provided with clearance holes formed in positions corresponding to positions of said part terminal insertion holes and said via holes, said inner layer pattern being continued all over an entire region of a substrate except said portions of said clearance holes.

2. A multilayer printed circuit board according to claim 1, in which said via holes are aligned along diagonal lines of said first and second main reference grid lines.

3. A multilayer printed circuit board according to claim 1, in which said first signal lines are disposed on central two of said first subsidiary grid lines obtained by equidistantly dividing each gap between adjacent ones of said first main reference grid lines into five portions, and said second signal lines are disposed on central two of said second subsidiary grid lines obtained by equidistantly dividing each gap between adjacent ones of said second main reference grid lines into five portions, and in which said via holes are two in number and are formed at positions which are displaced from intersecting points between said central two of said first subsidiary grid lines and said central two of said second subsidiary grid lines onto a diagonal line of said first and second main reference lines.

4. A multilayer printed circuit board according to claim 3, in which said two via holes are displaced to be close to the nearest intersecting points between said first and second main reference grid lines on said diagonal line.

5. A multilayer printed circuit board according to claim 1, in which said first signal lines are disposed on central three of said first subsidiary grid lines obtained by equidistantly dividing each gap between adjacent ones of said first main reference grid lines into six portions, and said second signal lines are disposed on central three of said second subsidiary grid lines obtained by equidistantly dividing each gap between adjacent ones of said second main reference grid lines into six portions, and in which said via holes are three in number and are formed at positions which are displaced from intersecting points between said central three of said first subsidiary grid lines and said central three of said second subsidiary grid lines onto a diagonal line of said first and second main reference lines.

6. A multilayer printed circuit board according to claim 5, in which a central one of said three via holes is formed at an intersecting point between said first and second subsidiary grid lines, and the other two of said three via holes are displaced to be close to the nearest intersecting points between said first and second main reference grid lines on said diagonal line.

7. A multilayer printed circuit board according to claim 1, in which said first signal lines are disposed on central four of said first subsidiary grid lines obtained by equidistantly dividing each gap between adjacent ones of said first main reference grid lines into seven portions, and said second signal lines are disposed on central four of said second subsidiary grid lines obtained by equidistantly dividing each gap between adjacent ones of said second main reference grid lines into seven portions, and in which said via holes are four in number and are formed at positions which are displaced from intersecting points between said central four of said first subsidiary grid lines and said central four of said second subsidiary grid lines onto a diagonal line of said first and second main reference lines.

8. A multilayer printed circuit board according to claim 7, in which said four via holes are displaced to be close to the nearest intersecting points between said first and second main reference grid lines on said diagonal line.

9. A multilayer printed circuit board according to claim 4, in which said clearance holes include one clearance hole for said part terminal insertion hole, and two clearance holes for said via holes adjacently disposed to said one clearance hole, said clearance holes being integrally formed with each other.

10. A multilayer printed circuit board according to claim 6, in which said clearance holes include one separately formed clearance hole used for said central via hole and other two clearance holes used for said via holes, each of said other clearance holes being integrally formed with a clearance hole for one of said part terminal insertion holes close to said via hole.

11. A multilayer printed circuit board according to claim 8, in which said four clearance holes used for said via holes are integrally formed with adjacent clearance holes used for said part terminal insertion holes.

12. A multilayer printed circuit board comprising:
part terminal insertion holes and part terminal insertion lands formed at intersecting points between a first plurality of main reference grid lines extending in one direction and a second plurality of main reference grid lines extending in the other direction perpendicular to said one direction;
at least two signal layers, one of said signal layers being constituted by first signal lines disposed on a plurality of ones of first subsidiary grid lines drawn parallelly with said first main reference grid lines on positions obtained by equidistantly dividing each gap between adjacent ones of said first main reference grid lines into n portions, the other one of said signal layers being constituted by second signal lines disposed on a plurality of ones of second subsidiary grid lines drawn parallelly with said second main reference grid lines on positions obtained by equidistantly dividing each gap between adjacent ones of said second main reference grid lines into n portions; and
via holes formed at positions displaced from intersecting points between said first and second signal lines, each of said via holes having a diameter smaller than that of each of said part terminal insertion holes and said part terminal insertion land, said via holes being exclusively used for connecting said first and second signal lines.

13. A multilayer printed circuit board according to claim 12, in which said via holes are aligned along diagonal lines of said first and second main reference grid lines.

14. A multilayer printed circuit board according to claim 12, in which said first signal lines are disposed on central two of said first subsidiary grid lines obtained by equidistantly dividing each gap between adjacent ones of said first main reference grid lines into five portions, and said second signal lines are disposed on central two of said second subsidiary grid lines obtained by equidistantly dividing each gap between adjacent ones of said second main reference grid lines into five portions, and in which said via holes are two in number and are formed at positions which are displaced from intersecting points between said central two of said first subsidiary grid lines and said central two of said second subsidiary grid lines onto a diagonal line of said first and second main reference lines.

15. A multilayer printed circuit board according to claim 14, in which said two via holes are displaced to be close to the nearest intersecting points between said first and second main reference grid lines on said diagonal line.

16. A multilayer printed circuit board according to claim 12, in which said first signal lines are disposed on central three of said first subsidiary grid lines obtained by equidistantly dividing each gap between adjacent ones of said first main reference grid lines into six portions, and said second signal lines are disposed on central three of said second subsidiary grid lines obtained by equidistantly dividing each gap between adjacent ones of said second main reference grid lines into six portions, and in which said via holes are three in number and are formed at positions which are displaced from intersecting points between said central three of said first subsidiary grid lines and said central three of said second subsidiary grid lines onto a diagonal line of said first and second main reference lines.

17. A multilayer printed circuit board according to claim 16, in which a central one of said three via holes is formed at an intersecting point between said first and second subsidiary grid lines, and the other two of said three via holes are displaced to be close to the nearest intersecting points between said first and second main reference grid lines on said diagonal line.

18. A multilayer printed circuit board according to claim 12, in which said first signal lines are disposed on central four of said first subsidiary grid lines obtained by equidistantly dividing each gap between adjacent ones of said first main reference grid lines into seven portions, and said second signal lines are disposed on central four of said second subsidiary grid lines obtained by equidistantly dividing each gap between adjacent ones of said second main reference grid lines into seven portions, and in which said via holes are four in number and are formed at positions which are displaced from intersecting points between said central four of said first subsidiary grid lines and said central four of said second subsidiary grid lines onto a diagonal line of said first and second main reference lines.

19. A multilayer printed circuit board according to claim 18, in which said four via holes are displaced to be close to the nearest intersecting points between said first and second main reference grid lines on said diagonal line.

20. A multilayer printed circuit board comprising:
an inner layer including an earthing layer and/or a power supply layer;
a surface layer including pattern wiring signal layer for signal lines;
mounted-parts terminal insertion holes and lands formed in said signal layer at intersecting points between first main reference grid lines extending in the longitudinal direction on said signal layer and second main reference grid lines extending in the transverse direction on said signal layer;
patterns each having a predetermined thickness and disposed on two longitudinal subsidiary grid lines and two transversal subsidiary grid lines respectively drawn at positions of 2/5 and 3/5 of each gap between adjacent ones of said lands, that is, between adjacent ones of said first main reference grid lines by equidistantly dividing said gap into five and drawn at positions of 2/5 and 3/5 of each gap between adjacent ones of said lands, that is, between adjacent ones of said second main reference grid lines by equidistantly dividing said gap into five;
two via holes each having a diameter smaller than that of each of said mounted-parts terminal insertion holes and lands and exclusively used for connecting said patterns thereto, said two via holes being formed at positions displaced by a predetermined distance diagonally outward from diagonally disposed two of four intersecting points between said longitudinal and transverse subsidiary grid lines; and
circular clearance holes formed at positions in said inner layer corresponding to the positions of said via holes to thereby standardize the pattern of said inner layer.

* * * * *